United States Patent
Lasten et al.

(10) Patent No.: US 9,939,478 B1
(45) Date of Patent: Apr. 10, 2018

(54) PASSIVE RADIO FREQUENCY ENERGY DETECTOR SYSTEMS AND METHODS

(75) Inventors: Raymond A. Lasten, Waldorf, MD (US); John H. Bray, Waldorf, MD (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 391 days.

(21) Appl. No.: 13/165,212

(22) Filed: Jun. 21, 2011

(51) Int. Cl.
G01R 29/10 (2006.01)
H01Q 1/24 (2006.01)

(52) U.S. Cl.
CPC ............ *G01R 29/10* (2013.01); *H01Q 1/243* (2013.01)

(58) Field of Classification Search
CPC ...................................................... G01R 29/10
USPC .......................................... 343/703; 340/600
See application file for complete search history.

(56) References Cited

U.S. PATENT DOCUMENTS

| | | | | |
|---|---|---|---|---|
| 3,927,375 A | * | 12/1975 | Lanoe et al. .................. | 343/894 |
| 3,939,770 A | | 2/1976 | Amundson et al. | |
| 4,032,910 A | * | 6/1977 | Hollway et al. .............. | 340/600 |
| 5,164,662 A | | 11/1992 | Emery et al. | |
| 5,874,724 A | | 2/1999 | Cato | |
| 6,054,848 A | | 4/2000 | Torres | |
| 6,232,881 B1 | * | 5/2001 | Suda .................. | G01R 29/0878 324/149 |
| 6,693,536 B2 | | 2/2004 | Bauer, Jr. et al. | |
| 2007/0195058 A1 | * | 8/2007 | Lin ............................... | 345/156 |
| 2008/0030325 A1 | * | 2/2008 | Fries .................. | G06K 19/0723 340/539.32 |
| 2012/0169569 A1 | * | 7/2012 | Roberts ......................... | 343/894 |
| 2012/0299396 A1 | * | 11/2012 | Baden et al. ................. | 307/149 |
| 2013/0021192 A1 | * | 1/2013 | Daly .............................. | 342/22 |

FOREIGN PATENT DOCUMENTS

| | | | |
|---|---|---|---|
| GB | 2254440 A | * | 10/1992 |
| KR | 2004026387 A | * | 3/2004 |

* cited by examiner

*Primary Examiner* — Dieu H Duong

(57) ABSTRACT

The present disclosure provides passive radio frequency (RF) detection systems and methods, which may include various exemplary circuit embodiments, a detection device, and methods associated therewith. The passive RF detection systems and methods provide passive detection of emitted RF energy. In an exemplary embodiment, the passive RF detection systems and methods may include fast switching and low forward-voltage drop diodes, a light emitting diode, a resistor, and an antenna, each of which may be disposed within or outside an external housing or packaging. In another exemplary embodiment, the passive RF detection systems and methods may include a push button switch for selective operation. Advantageously, the passive RF detection systems and methods are configured and operate in a completely passive manner.

19 Claims, 4 Drawing Sheets

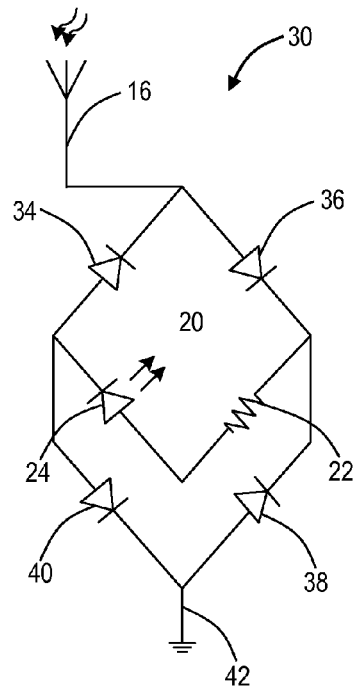
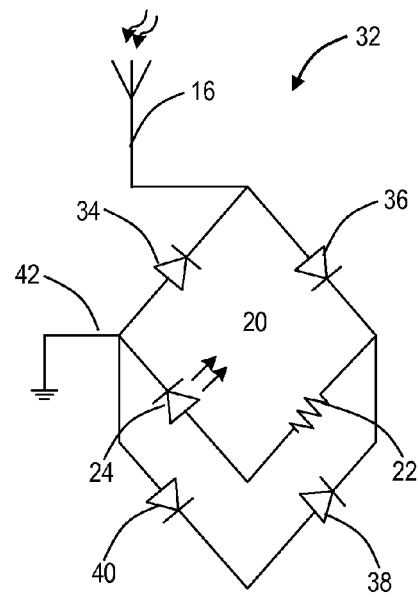
FIG. 3  FIG. 4
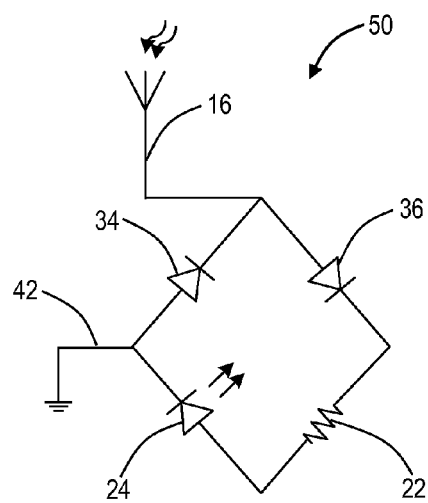
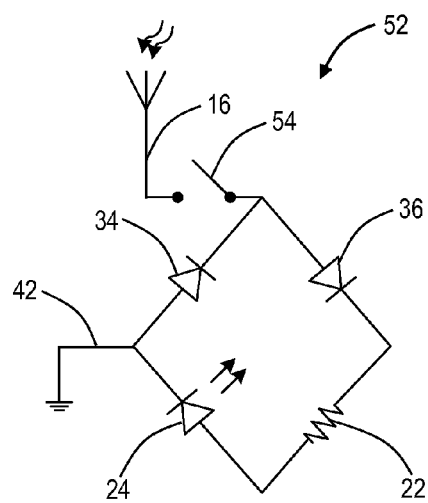
FIG. 5  FIG. 6

PASSIVE RADIO FREQUENCY ENERGY DETECTOR SYSTEMS AND METHODS

STATEMENT OF GOVERNMENT INTEREST

The present invention described herein may be manufactured and used by or for the Government of the United States of America for government purposes without the payment of any royalties thereon or therefore.

FIELD OF THE INVENTION

The present invention relates generally to a wireless signal detection system and method. More particularly, the present invention relates to passive radio frequency (RF) detection systems and methods.

BACKGROUND OF THE INVENTION

Conventionally, radio frequency detection systems and methods use active circuits to detect nearby radio frequency emissions. Such conventional systems and methods require power supplies and amplifiers in addition to other circuitry such as diodes, capacitors, etc. for detection and indication. Disadvantageously, these conventional systems and methods always require a power supply, which for handheld or mobile applications, typically requires batteries that must be recharged or replaced. The requirement for an active source for the conventional systems and methods is inconvenient, impractical, and sometimes unreliable.

SUMMARY OF THE INVENTION

In various exemplary embodiments, the present invention provides passive radio frequency (RF) detection systems and methods. In particular, the passive RF detection systems and methods may include various exemplary circuit embodiments, a detection device, and methods associated therewith. The passive RF detection systems and methods provide passive detection of emitted RF energy. In an exemplary embodiment, the passive RF detection systems and methods may include fast switching and low forward-voltage drop diodes, a light emitting diode, a resistor, and an antenna, each of which may be disposed within or outside an external housing or packaging. In another exemplary embodiment, the passive RF detection systems and methods may include a push button switch for selective operation. Advantageously, the passive RF detection systems and methods are configured and operate in a completely passive manner. Additionally, the passive RF detection systems and methods utilize a reduced complexity design, which is easy to manufacture at a lower cost relative to conventional systems and methods.

In an exemplary embodiment, a passive radio frequency emission detection circuit includes an antenna; a plurality of fast switching, low forward-voltage drop diodes coupled to the antenna; a resistor coupled to the plurality of fast switching, low forward-voltage drop diodes and the antenna; and a light emitting diode coupled to the resistor, the plurality of fast switching, low forward-voltage drop diodes, and the antenna. The passive radio frequency emission detection circuit may further include a switch coupled to the light emitting diode, the resistor, the plurality of fast switching, low forward-voltage drop diodes, and the antenna. The fast switching, low forward-voltage drop diodes may include germanium diodes or small signal Schottky diodes. The antenna may include a length selected based on operation parameters of the passive radio frequency emission detection circuit. The plurality of fast switching, low forward-voltage drop diodes may include a first diode and a second diode. Optionally, the antenna is connected between the first diode and the second diode, the resistor is connected between the second diode and the light emitting diode, and the first diode is connected between the light emitting diode and the antenna. The passive radio frequency emission detection circuit may further include a switch between the resistor and the light emitting diode; and ground between the first diode and the light emitting diode. The passive radio frequency emission detection circuit may further include a switch between the antenna, the first diode, and the second diode; and ground between the first diode and the light emitting diode. Alternatively, the antenna is connected between the first diode and the light emitting diode, the resistor is connected between the second diode and the light emitting diode, and the first diode is connected between the light emitting diode and the antenna. The light emitting diode may be configured to emit visible light at an intensity correlated to detection of radio frequency emissions.

In another exemplary embodiment, a passive radio frequency emission detection device includes a housing including an antenna section and a handle; an antenna disposed in the antenna section; a plurality of fast switching, low forward-voltage drop diodes coupled to the antenna and within the housing; a resistor coupled to the plurality of fast switching, low forward-voltage drop diodes and the antenna and within the housing; and a light emitting diode coupled to the resistor, the plurality of fast switching, low forward-voltage drop diodes, and the antenna, where the light emitting diode is disposed visibly within the housing or external to the housing. The passive radio frequency emission detection device may further include a switch coupled to the light emitting diode, the resistor, the plurality of fast switching, low forward-voltage drop diodes, and the antenna. The fast switching, low forward-voltage drop diodes may include germanium diodes or small signal Schottky diodes. The antenna may include a length selected based on operation parameters of the passive radio frequency emission detection circuit. The plurality of fast switching, low forward-voltage drop diodes may include a first diode and a second diode. Optionally, the antenna is connected between the first diode and the second diode, the resistor is connected between the second diode and the light emitting diode, and the first diode is connected between the light emitting diode and the antenna. Alternatively, the antenna is connected between the first diode and the light emitting diode, the resistor is connected between the second diode and the light emitting diode, and the first diode is connected between the light emitting diode and the antenna. The light emitting diode may be configured to emit visible light at an intensity correlated to detection of radio frequency emissions.

In yet another exemplary embodiment, a method includes providing a passive radio frequency emission device including a circuit configured to detect radio frequency emissions without requiring a power source; sweeping an object, area, or device with the passive radio frequency emission device; and viewing a light emitting diode coupled to the circuit for visible light emanating therefrom, where an intensity of the visible light is indicative of detection of radio frequency emissions. The circuit may include an antenna; a plurality of fast switching, low forward-voltage drop diodes coupled to the antenna; a resistor coupled to the plurality of fast switching, low forward-voltage drop diodes and the antenna;

and the light emitting diode coupled to the resistor, the plurality of fast switching, low forward-voltage drop diodes, and the antenna.

BRIEF DESCRIPTION OF THE DRAWINGS

The present invention is illustrated and described herein with reference to the various drawings, in which like reference numbers denote like method steps and/or system components, respectively, and in which:

FIG. 3 is a circuit diagram of a second exemplary passive RF detection circuit for passive RF detection systems and methods;

FIG. 4 is a circuit diagram of the second exemplary passive RF detection circuit of FIG. 3 with a different ground location for passive RF detection systems and methods;

FIG. 5 is a circuit diagram of a third exemplary passive RF detection circuit for passive RF detection systems and methods;

FIG. 6 is a circuit diagram of the exemplary passive RF detection circuit of FIG. 5 with an additional in-line switch for selective passive RF detection systems and methods;

DETAILED DESCRIPTION OF THE INVENTION

In various exemplary embodiments, the present invention provides passive radio frequency (RF) detection systems and methods. In particular, the passive RF detection systems and methods may include various exemplary circuit embodiments, a detection device, and methods associated therewith. The passive RF detection systems and methods provide passive detection of emitted RF energy. In an exemplary embodiment, the passive RF detection systems and methods may include fast switching and low forward-voltage drop diodes, a light emitting diode, a resistor, and an antenna, each of which may be disposed within or outside an external housing or packaging. In another exemplary embodiment, the passive RF detection systems and methods may include a push button switch for selective operation. Advantageously, the passive RF detection systems and methods are configured and operate in a completely passive manner. Additionally, the passive RF detection systems and methods utilize a reduced complexity design, which is easy to manufacture at a lower cost relative to conventional systems and methods.

Figure 1:
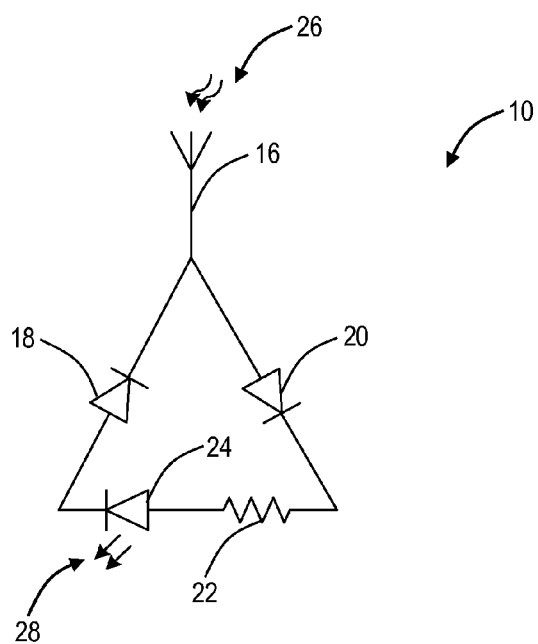
FIG. 1 is a circuit diagram of a first exemplary passive radio frequency (RF) detection circuit for passive RF detection systems and methods.
Figure 2:
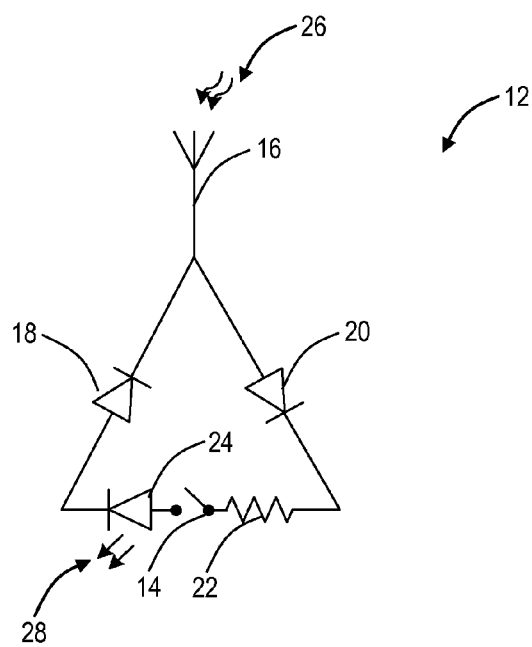
FIG. 2 is a circuit diagram of the first exemplary passive RF detection circuit of FIG. 1 with an additional in-line switch for selective passive RF detection systems and methods.

Referring to FIGS. 1 and 2, in an exemplary embodiment, circuit diagrams illustrate a first exemplary passive RF detection circuit 10, 12 for the passive RF detection systems and methods. The passive RF detection circuits 10, 12 in FIGS. 1 and 2 include similar designs but with the circuit 12 including an in-line push button 14 configured to turn the circuit 12 on and off whereas the circuit 10 is always on. The circuits 10, 12 include a RF antenna 16 coupled to two fast switching, low voltage drop diodes 18, 20. The circuits 10, 12 further include a low value resistor 22 between the diode 20 and a light emitting diode (LED) 24. In an exemplary embodiment, the low value resistor 22 may include a variable resistor allowing a user to adjust sensitivity of the circuits 10, 12 by varying the resistor 22 value.

The circuit 12 includes the push button 14 between the LED 24 and the resistor 22. The various components 14, 16, 18, 20, 22, 24 of the circuits 10, 12 may be package in a housing or the like. In the exemplary circuits 10, 12, the antenna 16 is connected between the diodes 18, 20; the diode 20 is connected between the antenna 16 and the resistor 22; the resistor 22 is connected between the antenna 24 and the diode 20; the LED 24 is connected between the resistor 20 and the diode 18; and the diode 18 is connected between the antenna 16 and the LED 24.

In operation, the circuits 10, 12 are configured to detect, passively, RF emissions 26 via light intensity 28 on the LED 24. That is, the circuits 10, 12 are configured to sweep or interrogate with the antenna 16 an area, object, etc., and if the LED 24 turns on, the antenna 16 detects RF energy radiating from the area, object, etc. The intensity of the LED 24 is a function of the power output level and frequency of the emitted RF energy. The fast switching, low voltage drop diodes 18, 20 are configured to operate as detector diodes. The fast switching, low voltage drop diodes 18, 20 used for the circuits 10, 12 affect the performance of the circuits 10, 12 and their selection depends on the desired operation parameters.

In an exemplary embodiment, the fast switching, low voltage drop diodes 18, 20 may include Schottky diodes. Further, the antenna 16 may include a particular length based on the desired operation parameters. For example, the antenna 16 may be longer for lower frequencies of detection. Also, in an exemplary embodiment, the LED 24 may include a MV8190 LED SUPER BRIGHT T-1¾ (5 mm) and the switching, low voltage drop diodes 18, 20 may include a 1N34A germanium diode or alternatively or small signal Schottky diodes. In another exemplary embodiment, the switching, low voltage drop diodes 18, 20 may include 1N5711 Schottky diodes instead of germanium ones.

Referring to FIGS. 3 and 4, in an exemplary embodiment, circuit diagrams illustrate a second exemplary passive RF detection circuit 30, 32 for the passive RF detection systems and methods. Initially, the passive RF detection systems and methods were investigated by attaching a BNC (Bayonet Neill-Concelman) connector to an SH-55 antenna and connecting two leads of an LED in reverse polarization. This initial configuration worked, but a lot of power was required to get reasonable visibility on the LED. The passive RF detection circuit 30, 32 introduced rectifying stages to this initial configuration.

The second exemplary passive RF detection circuit 30, 32 includes the antenna 16 coupled to diodes 34, 36, 38, 40 along with the LED 24 and the resistor 22. In a first exemplary embodiment, the diodes 34, 36, 38, 40 may form half-curve or full-curve rectifiers with the diodes 34, 36, 38, 40 being regular diodes. However, this provides poor results as the regular diodes have two big a voltage drop for low power applications. In another exemplary embodiment, the diodes 34, 36, 38, 40 may include fast switching, low voltage drop diodes such as 1N34A Germanium Diodes with a forward voltage drop of 1V or small signal Schottky diodes.

In the exemplary circuits 30, 32, the antenna 16 is connected between the diode 34 and the diode 36; the diode 36 is connected between the resistor 22 and the antenna 16; the resistor 22 is connected between the LED 24, the diode 38, and the diode 36; the LED 24 is connected between the resistor 22, the diode 34, and the diode 40; and the diode 34 is connected between the antenna 16, the LED 24, and the diode 40. In the circuit 30, the diode 38 is connected between the resistor 22, the diode 36, the diode 40, and ground 42; and the diode 40 is connected between the LED 24, the diode 24, the diode 38, and the ground 42. In the circuit 32, the ground 42 is located between the diode 34, the LED 24, and the diode 40, providing slightly between performance over the circuit 30.

Referring to FIGS. 5 and 6, in an exemplary embodiment, circuit diagrams illustrate a third exemplary passive RF detection circuit 50, 52 for the passive RF detection systems and methods. The passive RF detection circuit 50, 52 is formed from the circuits 30, 32 by omitting the bottom section including the diodes 38, 40. It was determined that these diodes 38, 40 have little effect on the circuit 30, 32 operations as little to no current was traversing this bottom section. Specifically, the circuits 50, 52 utilize a similar design as the circuit 32 without the diodes 38, 40. The circuit 52 includes an additional in-line push button switch 54 selectively connecting the antenna 16 to the diodes 34, 36.

Figure 7:
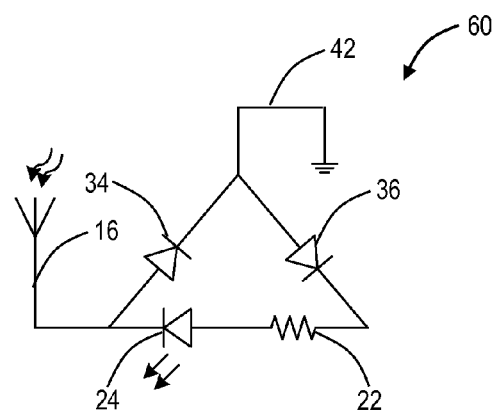
FIG. 7 is a circuit diagram of a fourth exemplary passive RF detection circuit for passive RF detection systems and methods.
Figure 8:
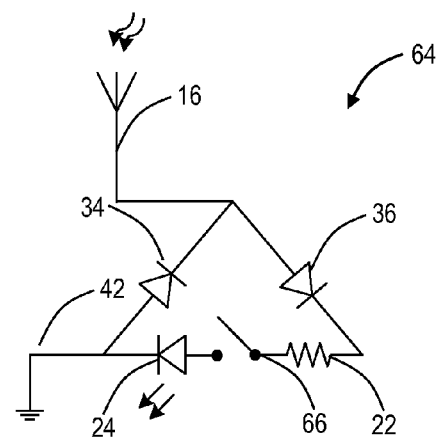
FIG. 8 is a circuit diagram of a fifth exemplary passive RF detection circuit for passive RF detection systems and methods.

Referring to FIGS. 7 and 8, in various exemplary embodiments, circuit diagrams illustrate a fourth and fifth exemplary passive RF detection circuit 60, 64 for the passive RF detection systems and methods. The exemplary circuits 60, 64 include variations of the exemplary passive RF detection circuit 50, 52. The exemplary circuit 60 swaps the antenna 16 position with the ground 42 position and this configuration provides improved performance, better frequency range, etc. The exemplary circuit 64 adds a switch 66 between the resistor 22 and the LED 24 such that RF detection can occur on-demand, i.e. when the switch 66 is active.

Figures 9, 10:
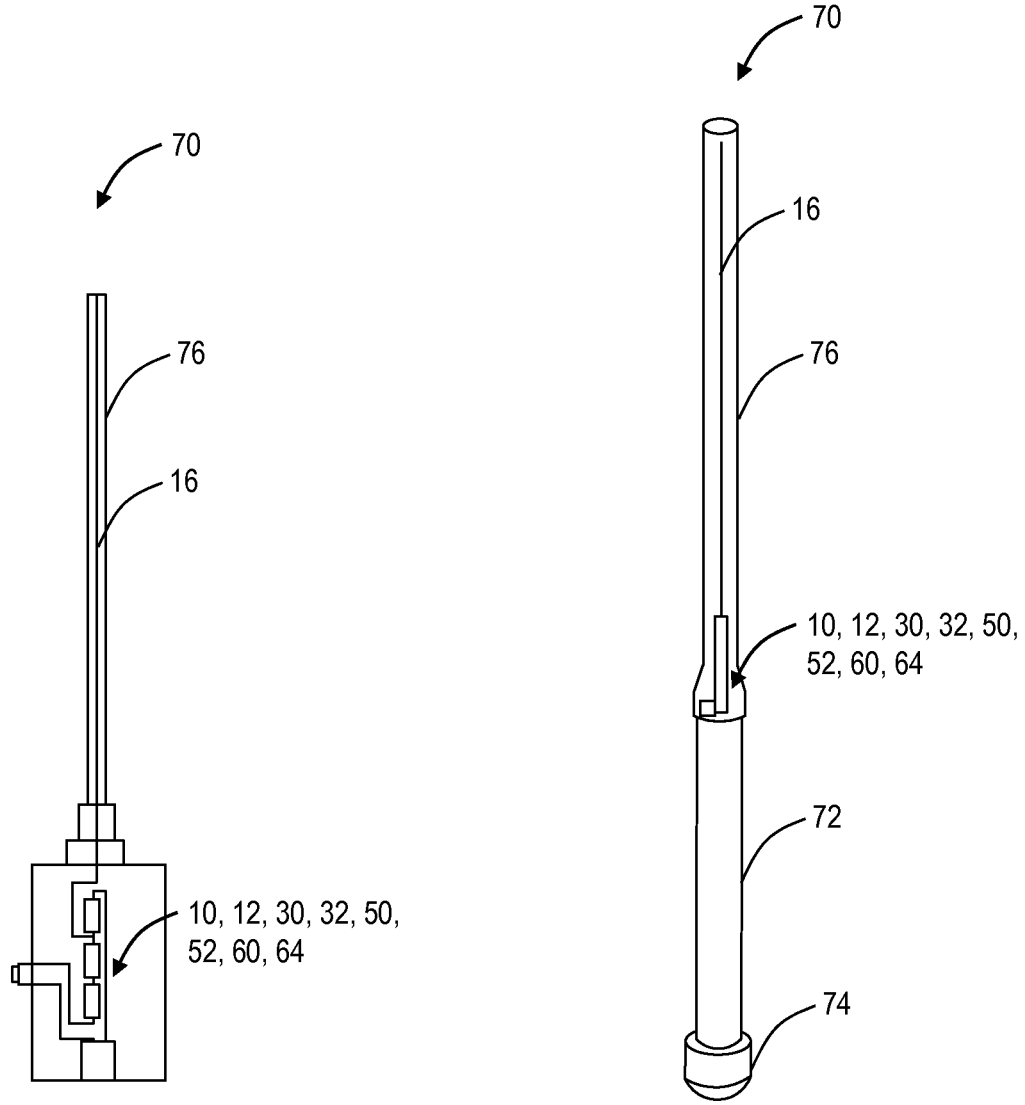
FIG. 9 is a block diagram of a passive RF detector for the passive RF detection systems and methods.
FIG. 10 is a perspective diagram of a passive RF detector for the passive RF detection systems and methods.

Referring to FIGS. 9 and 10, in an exemplary embodiment, a block diagram and a perspective view illustrate a passive RF detector 70 for the passive RF detection systems and methods. In particular, FIG. 9 is a block diagram illustrating any of the circuits 10, 12, 30, 32, 50, 52, 60, 64 disposed within the detector 70 and FIG. 10 is a perspective view of the detector 70. The detector 70 includes a handle 72 with an optional end cap 74 and an antenna section 76 extending from the handle 72. The circuits 10, 12, 30, 32, 50, 52, 60, 64 may be disposed within the handle 72 or the antenna section 76. The antenna 16 is configured to extend within the antenna section 16.

Advantageously, the detector 70 and the various circuits 10, 12, 30, 32, 50, 52, 60, 64 provide passive RF detection systems and methods over other conventional designs is that are completely passive. The conventional active designs require a dedicated power source to drive active components such as amplifiers, displays, integrated circuits, etc. while the passive RF detection systems and methods do not. Additionally, the various circuits 10, 12, 30, 32, 50, 52, 60, 64 require significantly less components than conventional active designs. This design also results in lower manufacturing and assembly costs while increasing reliability.

Although the present invention has been illustrated and described herein with reference to exemplary embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A passive radio frequency emission detection circuit, consisting of:
   an antenna;
   a plurality of fast switching, low forward-voltage drop diodes being coupled to the antenna;
   a resistor being coupled to the plurality of fast switching, low forward-voltage drop diodes and the antenna; and
   a light emitting diode being coupled to the resistor, the plurality of fast switching, low forward-voltage drop diodes, and the antenna,
   wherein said passive radio frequency emission detection circuit is a capacitorless passive radio frequency emission detection circuit, which uses environmental/radio frequency (RF) energy for electromagnetic detection absent a power supply as well as absent any capacitors, a transistor, an inductor, and a coil,
   wherein the antenna is a single monopole antenna connected between the plurality of fast switching, low forward-voltage drop diodes,
   wherein said plurality of fast switching, low forward-voltage drop diodes comprise a plurality of signal diodes, and
   wherein the resistor is in situated in series with one of the plurality of signal diodes connected to form continuity between a cathode of said one of the signal diodes and the light emitting diode for light emitting diode protection from a strong signal and passive radio frequency emission detection.

2. The passive radio frequency emission detection circuit of claim 1, further comprising:
   a switch being coupled to the light emitting diode, the resistor, the plurality of fast switching, low forward-voltage drop diodes, and the antenna.

3. The passive radio frequency emission detection circuit of claim 1, wherein the fast switching, low forward-voltage drop diodes comprise germanium diodes.

4. The passive radio frequency emission detection circuit of claim 1, wherein the antenna comprises a length selected based on operation parameters of the passive radio frequency emission detection circuit.

5. The passive radio frequency emission detection circuit of claim 1, wherein the plurality of fast switching, low forward-voltage drop diodes comprise a first diode and a second diode.

6. The passive radio frequency emission detection circuit of claim 5, wherein the antenna is connected between the first diode and the second diode, wherein the resistor is connected between the second diode and the light emitting diode, and wherein the first diode is connected between the light emitting diode and the antenna.

7. The passive radio frequency emission detection circuit of claim 5, further comprising a switch being situated between the resistor and a light emitting diode; and
a ground being situated between the first diode and the light emitting diode,
wherein the antenna is connected between the first diode and the second diode,
wherein the resistor is connected between the second diode and the light emitting diode, and
wherein the first diode is connected between the light emitting diode and the antenna.

8. The passive radio frequency emission detection circuit of claim 5, further comprising a switch being situated between the antenna, the first diode, and the second diode; and
a ground being situated between the first diode and the light emitting diode,
wherein the antenna is connected between the first diode and the second diode,
wherein the resistor is connected between the second diode and the light emitting diode, and
wherein the first diode is connected between the light emitting diode and the antenna.

9. The passive radio frequency emission detection circuit of claim 5, wherein the antenna is connected between the first diode and the light emitting diode, wherein the resistor is connected between the second diode and the light emitting diode, and wherein the first diode is connected between the light emitting diode and the antenna.

10. The passive radio frequency emission detection circuit of claim 1, wherein the light emitting diode is configured to emit visible light at an intensity correlated to detection of radio frequency emissions.

11. A passive radio frequency emission detection device, consisting of:
a housing comprising an antenna section and a handle;
an antenna being disposed in the antenna section;
a plurality of fast switching, low forward-voltage drop diodes being coupled to the antenna and within the housing;
a resistor being coupled to the plurality of fast switching, low forward-voltage drop diodes and the antenna and within the housing; and
a light emitting diode being coupled to the resistor, the plurality of fast switching, low forward-voltage drop diodes, and the antenna,
wherein the light emitting diode is disposed visibly within one of the housing and external to the housing,
wherein said passive radio frequency emission detection circuit is a capacitorless passive radio frequency emission detection circuit, which uses environmental/radio frequency (RF) energy for electromagnetic detection absent a power supply as well as absent any capacitors, a transistor, an inductor, and a coil,
wherein the antenna is a single monopole antenna connected between the plurality of fast switching, low forward-voltage drop diodes,
wherein said plurality of fast switching, low forward-voltage drop diodes comprise a plurality of signal diodes, and
wherein the resistor is in situated in series with one of the plurality of signal diodes connected to form continuity between a cathode of said one of the signal diodes and the light emitting diode for light emitting diode protection from a strong signal and passive radio frequency emission detection.

12. The passive radio frequency emission detection device of claim 11, further comprising:
a switch being coupled to the light emitting diode, the resistor, the plurality of fast switching, low forward-voltage drop diodes, and the antenna.

13. The passive radio frequency emission detection device of claim 11, wherein the fast switching, low forward-voltage drop diodes comprise germanium diodes.

14. The passive radio frequency emission detection device of claim 11, wherein the antenna comprises a length selected based on operation parameters of the passive radio frequency emission detection circuit.

15. The passive radio frequency emission detection device of claim 11, wherein the plurality of fast switching, low forward-voltage drop diodes comprise a first diode and a second diode.

16. The passive radio frequency emission detection device of claim 15, wherein the antenna is connected between the first diode and the second diode, wherein the resistor is connected between the second diode and the light emitting diode, and wherein the first diode is connected between the light emitting diode and the antenna.

17. The passive radio frequency emission detection device of claim 15, wherein the antenna is connected between the first diode and the light emitting diode, wherein the resistor is connected between the second diode and the light emitting diode, and wherein the first diode is connected between the light emitting diode and the antenna.

18. The passive radio frequency emission detection device of claim 11, wherein the light emitting diode is configured to emit visible light at an intensity correlated to detection of radio frequency emissions.

19. A method, comprising:
providing a passive radio frequency emission device comprising a circuit configured for detecting radio frequency emissions absent a power source;
sweeping one of an object, area, and device with the passive radio frequency emission device; and
viewing a light emitting diode being coupled to the circuit for visible light emanating therefrom,
wherein an intensity of the visible light is indicative of detection of radio frequency emissions;
wherein the circuit consisting of: an antenna;
a plurality of fast switching, low forward voltage drop diodes being coupled to the antenna;
a resistor being coupled to the plurality of fast switching, low forward-voltage drop diodes and the antenna; and
a light emitting diode being coupled to the resistor, the plurality of fast switching, low forward-voltage drop diodes, and the antenna,
wherein said circuit is a capacitorless passive radio frequency emission detection circuit, which uses environmental/radio frequency (RF) energy for electromagnetic detection absent a power supply as well as absent any capacitors, a transistor, an inductor, and a coil,
wherein the antenna is a single monopole antenna connected between the plurality of fast switching, low forward-voltage drop diodes,
wherein said plurality of fast switching, low forward-voltage drop diodes comprise a plurality of signal diodes, and wherein the resistor is in situated in series with one of the plurality of signal diodes connected to form continuity between a cathode of said one of the signal diodes and the light emitting diode for light emitting diode protection from a strong signal and passive radio frequency emission detection.

\* \* \* \* \*